(12) United States Patent
Ginetti

(10) Patent No.: US 10,354,037 B1
(45) Date of Patent: Jul. 16, 2019

(54) METHODS, SYSTEMS, AND COMPUTER PROGRAM PRODUCT FOR IMPLEMENTING AN ELECTRONIC DESIGN BY MANIPULATING A HIERARCHICAL STRUCTURE OF THE ELECTRONIC DESIGN

(71) Applicant: Cadence Design Systems, Inc., San Jose, CA (US)

(72) Inventor: Arnold Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 8 days.

(21) Appl. No.: 15/199,903

(22) Filed: Jun. 30, 2016

(51) Int. Cl.
*G06F 17/50* (2006.01)

(52) U.S. Cl.
CPC ...... *G06F 17/5072* (2013.01); *G06F 17/5036* (2013.01); *G06F 17/5045* (2013.01); *G06F 17/5068* (2013.01); *G06F 17/5081* (2013.01)

(58) Field of Classification Search
CPC ............. G06F 17/5036; G06F 17/5072; G06F 17/5081; G06F 17/5045; G06F 17/5068
See application file for complete search history.

(56) References Cited

U.S. PATENT DOCUMENTS

| | | | | |
|---|---|---|---|---|
| 5,249,133 A | * | 9/1993 | Batra | G06F 17/5081 716/112 |
| 5,568,396 A | * | 10/1996 | Bamji | G06F 17/5081 716/122 |
| 5,581,474 A | * | 12/1996 | Bamji | G06F 17/5081 703/2 |
| 6,289,412 B1 | * | 9/2001 | Yuan | G06F 17/5022 703/14 |
| 6,378,116 B1 | | 4/2002 | Ginetti | |
| 6,405,345 B1 | | 6/2002 | Ginetti | |
| 6,507,932 B1 | * | 1/2003 | Landry | G06F 17/5036 716/103 |
| 6,519,743 B1 | | 2/2003 | Nauts | |
| 6,622,290 B1 | | 9/2003 | Ginetti | |
| 6,622,291 B1 | | 9/2003 | Ginetti | |

(Continued)

OTHER PUBLICATIONS

"oaFigGroup Class Reference", URL: http://nx-soft.com/oaDoc_22.50p007_all/doc/oa/html/design/classoaFigGroup.html, 2002, Accessed on Jun. 2, 2016.

*Primary Examiner* — Helen Rossoshek
(74) *Attorney, Agent, or Firm* — Vista IP Law Group, LLP

(57) ABSTRACT

Disclosed are methods, systems, and articles of manufacture for manipulating a hierarchical structure of the electronic design. These techniques identify a set of layout components instantiated from a layout of an electronic design. This set of layout components may constitute, for example, a FigGroup. One or more schematic instances and corresponding schematic connectivity information may be identified from a schematic design of the electronic design, and the one or more schematic instances correspond to the set of layout components. A layout cell or a figure group may be generated for the set of layout components based in part or in whole upon the schematic connectivity information. The original layout may then be transformed into a transformed layout at least by replacing the set of layout components with the generated layout cell or figure group.

20 Claims, 13 Drawing Sheets

(56) References Cited

U.S. PATENT DOCUMENTS

| | | | |
|---|---|---|---|
| 6,738,957 B2 * | 5/2004 | Gont | G06F 17/5045 |
| | | | 716/102 |
| 7,418,683 B1 * | 8/2008 | Sonnard | G06F 17/5081 |
| | | | 716/122 |
| 7,448,003 B2 * | 11/2008 | Zhang | G06F 17/5045 |
| | | | 716/103 |
| 7,478,352 B2 * | 1/2009 | Chaplin | G06F 17/5095 |
| | | | 703/1 |
| 7,543,262 B2 * | 6/2009 | Wang | G06F 17/5063 |
| | | | 716/119 |
| 7,555,739 B1 | 6/2009 | Ginetti | |
| 7,634,743 B1 | 12/2009 | Ginetti | |
| 7,865,857 B1 * | 1/2011 | Chopra | G06F 17/5068 |
| | | | 716/119 |
| 7,949,983 B2 * | 5/2011 | Eshun | H01C 7/06 |
| | | | 716/103 |
| 7,949,987 B1 | 5/2011 | Ginetti | |
| 7,971,175 B2 | 6/2011 | Ginetti | |
| 7,971,178 B1 | 6/2011 | Marwah | |
| 8,028,243 B1 * | 9/2011 | O'Riordan | G06F 9/4443 |
| | | | 715/762 |
| 8,046,730 B1 | 10/2011 | Ferguson | |
| 8,255,845 B2 * | 8/2012 | Ginetti | G06F 17/5068 |
| | | | 716/100 |
| 8,281,272 B1 | 10/2012 | Ginetti | |
| 8,347,262 B2 * | 1/2013 | Zavadsky | G06F 17/5045 |
| | | | 716/100 |
| 8,453,136 B1 | 5/2013 | Hahn | |
| 8,490,038 B1 | 7/2013 | Arora | |
| 8,594,988 B1 | 11/2013 | Spyrou | |
| 8,640,078 B2 * | 1/2014 | Majumder | G06F 17/30 |
| | | | 716/100 |
| 8,640,079 B2 * | 1/2014 | Majumder | G06F 17/50 |
| | | | 716/100 |
| 8,719,754 B1 | 5/2014 | Ginetti | |
| 8,806,405 B2 | 8/2014 | Colwell | |
| 8,839,174 B2 * | 9/2014 | Suiter | G06F 17/5072 |
| | | | 716/118 |
| 8,898,618 B2 * | 11/2014 | Chin | G06F 3/0482 |
| | | | 703/13 |
| 8,910,100 B1 | 12/2014 | Wilson | |
| 9,092,586 B1 | 7/2015 | Ginetti | |
| 9,141,746 B1 | 9/2015 | Ginetti | |
| 9,208,273 B1 * | 12/2015 | Morlat | G06F 17/505 |
| 9,223,915 B1 | 12/2015 | Ginetti | |
| 9,317,650 B2 * | 4/2016 | Chen | G06F 17/5077 |
| 9,761,204 B1 | 9/2017 | Ginetti | |
| 9,779,193 B1 * | 10/2017 | Ginetti | G06F 17/5045 |
| 9,798,840 B1 | 10/2017 | Ginetti | |
| 9,830,417 B1 | 11/2017 | Ginetti | |
| 9,842,183 B1 | 12/2017 | Ginetti | |
| 9,881,119 B1 | 1/2018 | Kukal | |
| 9,881,120 B1 | 1/2018 | Ginetti | |
| 9,934,354 B1 | 4/2018 | Kukal | |
| 10,055,528 B1 * | 8/2018 | Ginetti | G06F 17/5072 |
| 10,073,942 B1 * | 9/2018 | Ginetti | G06F 17/5072 |
| 2010/0115207 A1 | 5/2010 | Arora | |
| 2010/0306729 A1 * | 12/2010 | Ginetti | G06F 17/5068 |
| | | | 716/124 |
| 2011/0016423 A1 * | 1/2011 | Brubaker | G06F 3/0481 |
| | | | 715/800 |
| 2011/0061034 A1 | 3/2011 | Ginetti | |
| 2011/0161899 A1 | 6/2011 | Ginetti | |
| 2012/0047434 A1 | 2/2012 | Ginetti | |
| 2013/0246900 A1 | 9/2013 | Ginetti | |
| 2013/0290834 A1 | 10/2013 | Ginetti | |
| 2014/0325460 A1 * | 10/2014 | Ferguson | G06F 17/5036 |
| | | | 716/103 |
| 2015/0012895 A1 * | 1/2015 | Chen | G06F 17/5077 |
| | | | 716/52 |
| 2017/0124235 A1 * | 5/2017 | Ferguson | G06F 17/5027 |
| 2017/0249416 A1 * | 8/2017 | Sendig | G06F 17/5077 |

* cited by examiner

METHODS, SYSTEMS, AND COMPUTER PROGRAM PRODUCT FOR IMPLEMENTING AN ELECTRONIC DESIGN BY MANIPULATING A HIERARCHICAL STRUCTURE OF THE ELECTRONIC DESIGN

BACKGROUND

Modern electronic designs often include various cells such as some off-the-shelf configurable or non-configurable library cells, intellectual property (IP) cells, macro cells, etc. Each of these cells may be instantiated multiple times as instances in an electronic design so that when a designer desires or requires to make a change to this cell, the designer only needs to make the change once, and all the change will be automatically reflected in all the instances in the electronic design to save development efforts and to expedite the design cycles so as to shorten the time-to-market of the eventual products.

Conventional electronic design implementations include a top-down and a bottom-up approach. A top-down approach begins the implementation process at the top or highest hierarchy and proceeds to lower hierarchies until it reaches the lowest hierarchy to complete an IC design. With the top-down approach, the functional cells at a higher hierarchy may be brought into the layout canvas while each cell include its own pins, ports, or terminals (collectively pin for singular or pins for plural hereinafter). The details of these functional cells at lower hierarchies are not yet exposed and will be designed at respective lower hierarchies as the top-down approach migrates to lower hierarchies. As a result of the non-exposure or unavailability of lower hierarchies (e.g., the lower hierarchies have not yet been implemented), a circuit designer working on a higher hierarchy may need to estimate the size of each cell and guess or guesstimate the locations of pins or terminals for the cell. The estimated cell may be too big to waste invaluable space on silicon or may be too small to accommodate all the devices therein.

In addition to the manual efforts to create the location, identification, etc. for a pin of a cell, these guesstimated pin or terminal locations unlikely to be optimal for connecting with the pins or ports of the devices within the cell. Either way, multiple iterations may be required for even a single cell. In addition, even if the circuit designer knows how these pins are connected to each other, the circuit designer may only align or offset these pins by manipulating the cell. In the event that a designer groups a set of components or cells and intends to create a logical cell for the set, the pins of the logical cell or their identifications thereof (e.g., names of the pins) have to be manually created. The designer will then have to find the corresponding pin identifications in the schematic design and associated these manually created identifications with the corresponding pin identifications.

Bottom-up approaches begin with the design of discrete circuit components and proceed to higher hierarchies as the designs of lower hierarchies are complete until the design for the top or highest hierarchy is complete. In these bottom-up approaches, pins and their identifications as well as locations are determined at lower hierarchies in their respective cells. At the higher hierarchies, these pins often present a challenge to routing these pins of an actual or virtual cell because these pins are determined individually for each cell and independent of each other and may thus cause misalignment of pins or terminals at higher hierarchies where these cells are assembled and supposed to be interconnected. To rectify these problems such as pin or terminal misalignment at higher hierarchies, the design process must return to the lower hierarchies where the devices with the misaligned pins are placed, adjust the placement of the devices, and determine whether the pins or terminals are aligned at the next higher hierarchy. These conventional approaches must then proceed to the next higher hierarchy to determine whether there exist other misalignment problems. These conventional approaches may thus iterate multiple times until an acceptable or desirable solution is found. Therefore, there is a need for a better approach to manipulate the hierarchies of an electronic design to effectively and efficiently create a cell for a group of devices.

The problem is exacerbated during the prototyping, floorplanning, placement stage or during the implementation of a portion of an electronic design where no existing IP cells or blocks are available. For example, a designer may be implementing a portion of the design corresponding to a new design for which no existing cells or blocks are available. As another example, a designer may then need to lay out this portion by placing individual components. The design may then need to create one or more cells or blocks for these newly inserted layout components either because of a design requirement or because of a desire or need for reducing the complexity in the appearance of the layout. In these embodiments, the designer may first place a plurality of layout components in a layout and attempt to create one or more cells for the plurality of layout components. Moreover, many of these layout components may need to be moved or modified to fit various design requirements during these stages. Some conventional approaches group the selected layout components into a cell but do not add any connectivity to such a cell. For example, a cell created by these conventional approaches may have no ports, pins, or terminals to connect to the remaining portion of the electronic design to which this newly created cell belongs. Some conventional approaches attempt to rectify this shortcoming by requiring manual creation of the boundary as well as manual determination of various connections (e.g., pins, terminals, ports, etc.) along the manually created boundary. These conventional approaches invariably involve some guesstimates and hence a number of iterations to finally create the cell with usable connections along the boundary of the cell.

Therefore, there exists a need for methods, systems, and computer program products for implementing an electronic design by manipulating a hierarchical structure of the electronic design.

SUMMARY

Disclosed are method(s), system(s), and article(s) of manufacture for implementing an electronic design by manipulating a hierarchical structure of the electronic design in one or more embodiments. Some embodiments are directed at a method for manipulating a hierarchical structure of the electronic design. In these embodiments, these described techniques identify a set of layout components instantiated from a layout of an electronic design. These techniques identify a set of layout components instantiated from a layout of an electronic design. One or more schematic instances and corresponding schematic connectivity information may be identified from a schematic design of the electronic design, the one or more schematic instances corresponding to the set of layout components. A figure group may be generated for the set of layout components based in part or in whole upon the schematic connectivity information. The original layout may then be transformed into a transformed layout at least by replacing the set of layout components with the figure group. It shall be noted that a figure group generated by these techniques described herein resembles and may in fact constitute a layout cell. This is in sharp contrast with the FigGroup in OpenAccess. More specifically, an OpenAccess FigGroup does not include any pins, ports, or terminals to connect the FigGroup with the remaining portion of a layout. That is, an OpenAccess FigGroup constitutes a mere container for the figures representing the corresponding layout components. In contrast, a figure group generated by these techniques described herein includes not only the pins, ports, or terminals along the boundary of the figure group without involving any guesstimates for the locations or identifications of these pins, ports, or terminals. In addition, a FIG. group described herein also includes the layout connectivity information for layout components within the figure group as well as for connections between the figure group and the remaining portion of the layout where the figure group belongs. In this application, the term "layout cell" and "figure group" may be used interchangeably unless otherwise specifically specified or claimed.

In some of these embodiments, the set of layout components may be synchronized with one or more additional sets of layout components, which are instantiated from the one or more schematic instances, based in part or in whole upon one or more criteria. In addition or in the alternative, the one or more criteria may comprise whether first structural information of the set of layout components and second structural information of an additional set of layout components are identical or substantially similar.

In some embodiments, a boundary may be determined for the figure group based in part or in whole upon one or more characteristics of the set of layout components; a set of figures to be included in the figure group may be determined, wherein the set of figures represents an area approximately or exactly occupied by the set of layout components in the layout; and the boundary and the set of figures may be associated with the figure group. In some of these immediately preceding embodiments, layout connectivity information may be identified for the figure group based in part or in whole upon the corresponding schematic connectivity information. At least a part of the schematic connectivity information may be populated to the figure group based in part or in whole upon correspondence between the one or more schematic instances in the schematic design and the set of layout components in the layout in some of the embodiments.

In addition or in the alternative, a set of pin identifications may be extracted for a set of layout pins to be arranged along the boundary of the figure group; and respective layout pin locations may be determined for the set of layout pins. In addition, the set of layout pins at the respective layout pin locations may be determined along the boundary of the figure group; and the figure group may be updated with results of arranging the set of layout pins at the respective layout pin locations along the boundary.

In some of the immediately preceding embodiments, one or more net segments in the layout may be identified; a set of intersections between the boundary of the figure group and the one or more net segments may be determined; and the respective layout pin locations may be determined for the set of layout pins based in part or in whole upon the set of intersections.

In some embodiments, one or more additional sets of layout components that correspond to the one or more schematic instances in the schematic design may be identified; one or more clones may be determined for the set of layout components; a clone data structure may be constructed to track the set of layout components and the one or more clones; and the layout may be transformed into a first transformed layout at least by replacing the one or more clones of the set of the one or more additional sets of layout components with one or more additional instances of the figure group.

In some embodiments, the set of layout components in the layout may be removed, suppressed, or pushed down so that the set of layout components is not shown in the layout; the figure group may be added into the layout and affixed with a handle; and interconnections between the figure group and a remaining portion of the layout may be established by using at least layout connectivity information that is derived from the schematic connectivity information.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
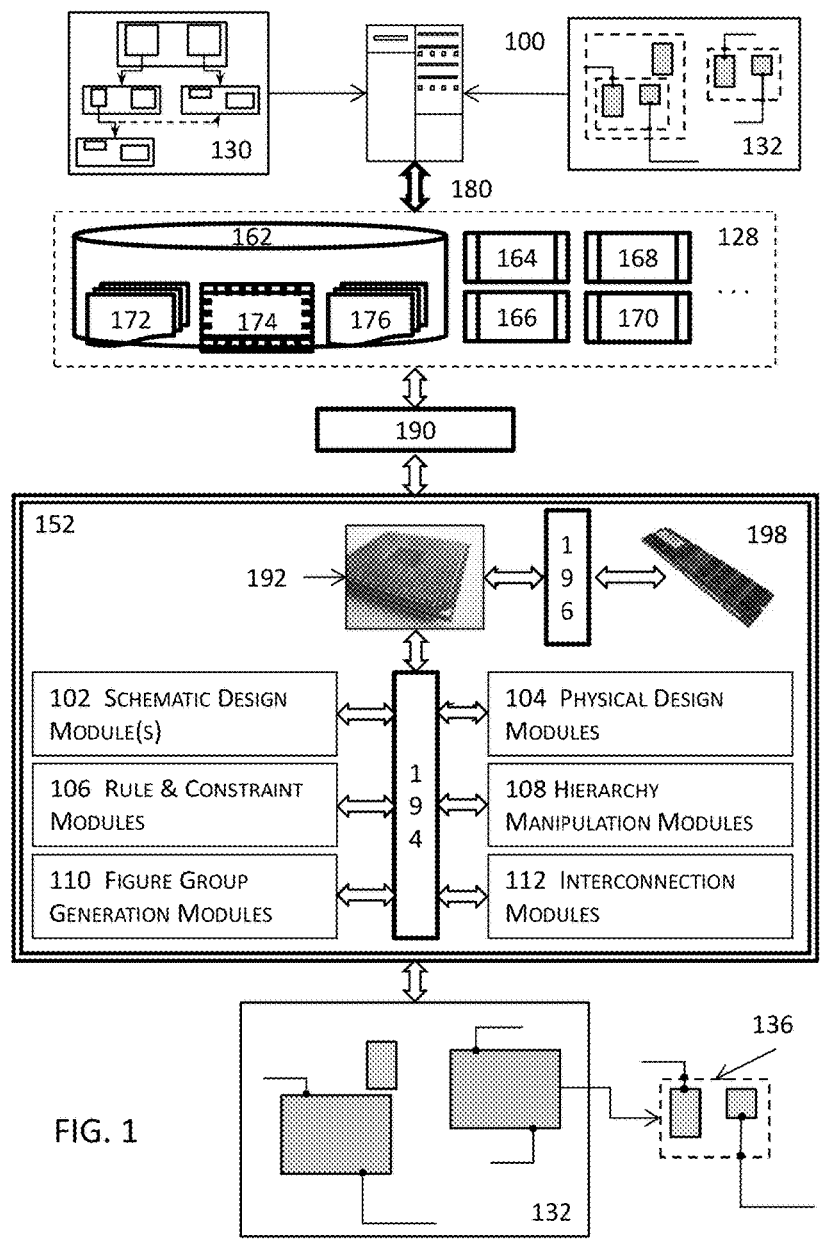
FIG. 1 illustrates a high level block diagram of a system for manipulating a hierarchical structure of the electronic design in one or more embodiments.

Various techniques are directed to manipulating the hierarchical structure of an electronic design by creating at least an additional hierarchy for a plurality of circuit component designs in a flat or hierarchical electronic design. In these embodiments where a designer may implement an electronic design in a flat layout and stay with the flat layout for as long as possible to have a complete picture of the entire electronic design. This is in part due to the reasons that, for example, not all circuit component designs are available as an existing cell or block, or that some customizations may be desired or required even when an existing cell or block is available for a portion of the electronic design.

A designer may thus implement at least a portion of the electronic design in a flat layout portion. When the implementation of this flat layout portion is complete, the designer may desire to represent this flat layout portion as a cell or block. Conventionally, this may be achieved by, for example, selecting the circuit component designs and make a new cell or block for the selected circuit component designs by making a boundary to enclose these selected circuit component designs. Although this boundary includes the physical design details for the newly created cell or block, this approach falls short because this boundary of the new cell will not have any connectivity. One remedy for these conventional approaches is to have the designer guess and manually create the connectivity along the boundary of this newly created cell.

These techniques described herein for the second embodiments resolve all these issues. More specifically, these techniques create a plurality of layout circuit components by instantiating these layout circuit component instances according to the corresponding schematic design. These techniques further maintain correspondence between these layout circuit component instances and the corresponding schematic symbols. These techniques reference the schematic design with, for example, a schematic editor and extract the connectivity information from the schematic design. This connectivity information includes, for example, the identifications of various nets, the identifications of the ports, pins, and terminals of the corresponding schematic instances. The layout editor where the layout circuit component designs are selected for the creation of a cell or block may obtain the connectivity information from the schematic design via the schematic editor and populate the retrieved connectivity information to the corresponding layout circuit components. More specifically, the corresponding pins, terminals, and ports in the layout circuit components may now be associated with or include their respective identifications, and their locations relative to the newly created cell or block may be ascertained.

These layout circuit components may then be removed from the layout and replaced with a new cell or block represented by the created boundary. With the connectivity information obtained from the schematic design, the boundary of the new cell or block may now include the corresponding pins, terminals, or ports. In some embodiments, the boundary of a new cell or block may be determined as the minimal bounding box of the plurality of layout component designs enclosed therein. In these embodiments, the pins, ports, or ports for the newly created cell or block may be determined as pins, ports, or terminals along the boundary (the min. bounding box) of the plurality of layout component designs, and the identifications of these pins, ports, or terminals may be populated from the schematic design into the layout.

In some other design where the boundary of the newly created cell or block is larger than the minimal bounding box, these pins, ports, or terminals may be determined as the interactions of topological routes, if available, or global routes between the boundary of the newly created cell and corresponding pins, ports, or terminals of the plurality of layout component designs. In these embodiments, the identifications of these pins, ports, or terminals, if available, may also be populated from the schematic design into the layout. If some or all of the selected layout component designs have been routed, these techniques may automatically construct a new cell, block, or figure group in the layout for these selected layout component designs, determine the connectivity information of various pins, terminals, or ports for this cell, block, or figure group, replace the selected layout component designs with the newly constructed cell, block, or figure group in the layout, and reestablish the connections by using the connectivity information of various pins, terminals, or ports of this cell, block, or figure group.

In this manner, a designer may select a group of layout component designs, create a new cell or block for the selected group of layout component designs, and represent the selected group of layout component designs with this newly created cell or block in the layout. A designer may also directly manipulate the newly created cell or block as the designer may with any other layout component designs. In addition, if a designer needs to edit the contents of a new created cell or block, the designer may descend into the cell or block in the layout editor which will then show the first lower hierarchy in the newly created cell as the layout editor does for any other hierarchical cells or blocks.

A designer may also create a figure group for this newly created cell or block or may directly create a new figure group for the selected layout component designs by aggregating the set of figures representing the selected layout component designs as a set of figures. Similar to creating a boundary for a newly created cell or block, a figure group may be created by identifying a plurality of device designs in a layout and by creating a boundary or a bounding box enclosing the plurality of identified device designs. The boundary or bounding box may be created to be the minimum rectangular box enclosing the plurality of device designs in some embodiments.

In some other embodiments, a boundary or bounding box may be created to be the minimum bounding box of the plurality of device designs plus an offset to enclose the plurality of device designs. A figure group may be nested within another figure group, and a figure group may also be nested within the same figure group. In these third embodiments, these techniques effectively create a new logical or virtual hierarchy in the layout by adding a newly created cell, block, or figure group at a higher hierarchical level than the selected group of layout component designs.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

FIG. 1 illustrates a high level block diagram of a system for manipulating a hierarchical structure of the electronic design in one or more embodiments. In these one or more embodiments, the hardware system in FIG. 1 may comprise one or more computing systems 100, such as one or more general purpose computers described in the System Architecture Overview section to implement one or more special proposes.

In some embodiments, the one or more computing systems 100 may invoke various system resources such as the processor(s) or processor core(s), memory, disks, etc. and receive a schematic design 130 and a layout 132 of an electronic design. The one or more computing systems 100 may also initiate or interact with other computing systems to access, via a computer bus architecture (e.g., a system bus, a control bus, a data bus, or any combinations thereof), various resources 128 that may comprise a floorplanner, a placement module, a global routing module, and/or a detail routing module 164, a layout editor 166, a design rule checker 168, a verification engine 170, etc.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various statistics, various data, rule decks, various design rules, constraints, etc. (172), or other information or data (176) that may be used to facilitate the performance of various functions to achieve the intended purposes. The one or more databases 174 may further include a plurality of cells, blocks, or modules (collectively a cell for singular and cells for plural). Cells may include, for example, one or more standard cells, one or more library cells, one or more memory cells, one or more macro cells, or any combinations thereof. A cell may be an object of a class in the paradigm of object oriented programming and may thus be instantiated into multiple instances to create at least a portion of a hierarchical physical design (e.g., a floorplan, a layout, etc.) or to create a larger and/or more complex cell in some embodiments. In the real hierarchy structure of a hierarchical physical design, certain cells may be situated at the lowest hierarchical level and do not contain any lower hierarchies.

In some embodiments, the one or more computing systems 100 may include or, either directly or indirectly through the various resources 128, invoke a set of mechanisms or modules 152 including hardware and software modules or combinations of one or more hardware and one or more software modules that are stored at least partially in computer memory may comprises one or more schematic design modules 102 to natively access or otherwise manipulate schematic designs of electronic designs for various purposes such as retrieving information (e.g., connectivity information, etc.) from a schematic design. The set of modules 152 may further include one or more physical design modules 104 such as a floorplanner module to generate a floorplan for an electronic design, a flat or hierarchical placement module to place cells or individual layout components in a flat or hierarchical physical design, a flat or hierarchical routing module to perform various routing (e.g., global routing, detail routing, conduit routing, channel-routing, etc.) across and/or within each of multiple hierarchies in a hierarchical physical design.

The set of modules 152 may further optionally include one or more rule and constraint modules 106 to maintain and/or enforce various design constraints, design rules, and/or requirements (e.g., manufacturability requirements, reliability requirements, signal integrity requirements, etc.) Constraints, design rules, and requirements are collectively referred to as a design rule for singular or design rules for plural. In addition or in the alternative, the set of modules 152 may further include one or more hierarchy manipulation modules 108 to create a cell for a plurality of individual layout components and/or one or more cells. These one or more hierarchy manipulation modules 108 may not only create the boundary of a cell but also the connectivity for layout elements within as well as outside the newly created cell.

In some embodiments, the set of modules 152 may further include one or more figure group generation modules 110 to function in conjunction with one or more other modules to generate a figure group for a plurality of individual layout components and/or one or more cells. For example, a figure generation module 108 may function in tandem with a schematic design module 102 or a physical design module 104 to identify a plurality of layout components and/or one or more cells, invoke the hierarchy manipulation module 108 to create the boundary for a newly created cell into which the plurality of layout components and/or one or more cells are to be included, invoke the physical design module 104 to determine the figures representing the plurality of layout components and/or one or more cells and to replace the plurality of layout components and/or the one or more cells from the layout with the figures, invoke the rule and constraint module 106 to ensure that these figures are arranged in a manner that complies with various design rules, and to call the interconnection module 108 and the schematic design module 102 to retrieve connectivity information from the schematic design 130 and to reconnect the figures in the newly created cell.

Once a new cell 136 is created, the layout 132 may be modified by replacing individual layout components (and/or one or more cells at lower hierarchies) with the newly created cell 130. When more details about a newly created cell need to be exposed or accessed, these techniques may allow a designer may descent from a higher hierarchy in the layout 132 into the cell 136 or any lower hierarchies therein.

The set of modules 152 may further optionally include one or more signoff modules (not shown) to perform various signoff and design closure tasks to ensure that the electronic design implemented by various techniques described herein may be successfully fabricated while maintaining various performance, cost, reliability, and manufacturability requirements.

For example, the one or more signoff modules may include one or more timing signoff modules to perform timing analyses and timing closure related tasks (e.g., silicon-accurate timing signoff, signal integrity analyses, etc.) to ensure an electronic design meets power, performance, or other requirements before tapeout, one or more signoff parasitic extraction modules to provide silicon-accurate interconnect parasitic extraction and ensure first-pass silicon success, and one or more power signoff modules to perform various power integrity analyses, transistor-level electromigration and IR-drop analyses, or other power and signal integrity analyses with SPICE-level accuracy or better accuracy with SPICE or SPICE-like simulations (e.g., Fast-SPICE, HSPICE, PSPICE, or any other SPICE-based or SPICE-compatible simulations) to ensure an electronic design meets or exceeds power, performance, and/or area goals in some embodiments.

The one or more signoff modules may include one or more physical verification modules (not shown) to perform various design rule checking, layout vs. schematic (LVS), etc. tasks to ensure that an electronic design meets or exceeds various spatial and other physical rules and one or more design for manufacturing (DFM) modules to address physical signoff and electrical variability optimization, correct lithography hotspots, predict silicon contours, improve yield, detect and repair timing and leakage hotspots to achieve variation- and manufacturing-aware signoff and design closure in some of these embodiments.

In addition or in the alternative, the one or more signoff modules may include one or more one or more computational lithography modules (not shown) to provide more accurate post-etch critical dimension accuracy and process windows on silicon, reticle and wafer synthesis, etc. to eliminate errors and/or reduce mask-manufacturing cycle times. One or more of these signoff modules may operate on the electronic design produced or modified with various techniques to be described in the following sections for proper signoff and design closure so that the signoff version of the electronic design may be properly manufactured with first-pass or fewer passes silicon success in some embodiments. In these embodiments, the signoff version of the electronic design produced or modified with various techniques described herein causes the underlying electronic circuit to be manufactured by a foundry or IC (integrated circuit) fabrication facility when the signoff version of the electronic design is forwarded to the foundry or IC (integrated circuits) fabrication facility that in turn fabricates the requisite photomasks and the eventual electronic circuit.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The computing system may also include one or more modules in the set of modules 152. One or more modules in the set 152 may include or at least function in tandem with a microprocessor 192 via a computer bus 194 in some embodiments. In these embodiments, a single microprocessor 192 may be included in and thus shared among more than one module even when the computing system 100 includes only one microprocessor 192. A microprocessor 192 may further access some non-transitory memory 198 (e.g., random access memory or RAM) via a system bus 196 to read and/or write data during the microprocessor's execution of processes.

Figure 2:
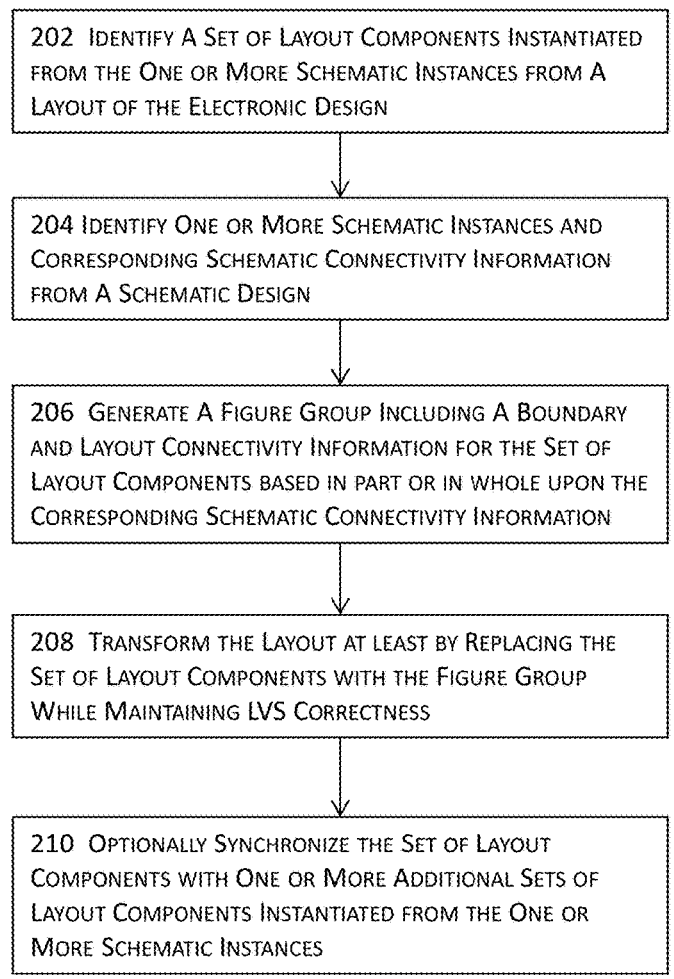
FIG. 2 illustrates a high level block diagram for manipulating a hierarchical structure of the electronic design in one or more embodiments.

FIG. 2 illustrates a high level block diagram for manipulating a hierarchical structure of the electronic design in one or more embodiments. In these embodiments, a set of layout components that are instantiated from the one or more schematic instances or schematic circuit components may be identified at 202 from the layout of the electronic design. The set of layout components may be identified in many different ways. For example, a designer may select the set of layout components from the layout in a user interface of a physical design module (e.g., 104).

One or more schematic instances or schematic circuit components and their corresponding connectivity information may be identified at 204 from a schematic design based in part or in whole upon the set of layout components identified at 202. The one or more schematic instances or schematic circuit components correspond to those from which the set of layout components identified at 202 is instantiated. The connectivity information identified at 204 indicates how the one or more schematic instances or circuit components are connected with each other as well as with the remaining portion of the schematic design. The connectivity information may be subsequently used in reconnecting the newly constructed figure group in the layout.

A layout may generally be created by instantiating layout components from each of the schematic instances or schematic circuit components in the corresponding schematic design. As a result, the corresponding schematic instance or schematic circuit component may be identified once the layout components are identified.

A figure group may then be generated at 206. A figure group may be created by identifying a plurality of layout components in a layout, representing the plurality of layout components as respective figures, and by creating a boundary or a bounding box enclosing the plurality of identified device designs. Each figure in a figure group exactly or approximately depicts the geometric area occupied by its corresponding layout component. The boundary or bounding box for a figure group may be created to be the minimum rectangular box enclosing the plurality of device designs in some embodiments or the minimum bounding box of the plurality of device designs plus an offset to enclose the plurality of device designs in some other embodiments.

The figure group generated at 206 may further include layout connectivity information for the set of layout components based in part or in whole upon the schematic connectivity information from the corresponding schematic design. This layout connectivity information may be generated by, for example, populating the corresponding schematic connectivity information to the figure group in some embodiments. For example, the identifications of various pins, ports, or terminals (collectively a pin for singular or pins for plural) may be identified from the schematic connectivity information and populated into the corresponding pins, ports, or terminals in the set of layout components and hence the figure group. In some of these embodiments where the set of layout components has been routed, the identifications of one or more nets may also be retrieved from the schematic connectivity information and populated into one or more corresponding nets in the figure group in an identical or substantially similar manner.

Once the figure group is generated for the set of layout components identified at 202, the layout may be transformed into a transformed layout at 208 at least by replacing the set of layout components with the figure group generated at 206. The revision of the layout remains LVS (layout versus schematic) correct because all the manipulations performed on the layout emanate based on the corresponding schematic design. A figure group described herein may be used in identical or substantially similar manners as a conventional cell, block, or module in a conventional layout but with much less computational resource utilization because a figure group may be considered as a light-weight cell or block including the figures that represent the corresponding layout components in the layout.

One example use of figure groups is to quickly and effectively determine clones in a layout of an electronic design. For example, various techniques described herein may automatically generate figure groups in the layout for each of the one or more schematic instances or schematic circuit components in the corresponding schematic design. These techniques may then determine whether the figure group generated at 206 and another figure group are clones of each other by examining, for example, the topological information of these two figure groups. In this manner, these techniques may identify a set of clones for the figure group generated at 206 in the layout and may optionally synchronize these clones at 210 so that when one figure group in the set of clones is modified, the same modification is automatically populated among all the remaining figure groups in the set of clones. More details about figure groups will be described below with reference to FIGS. 3A-C.

Figure 3A:
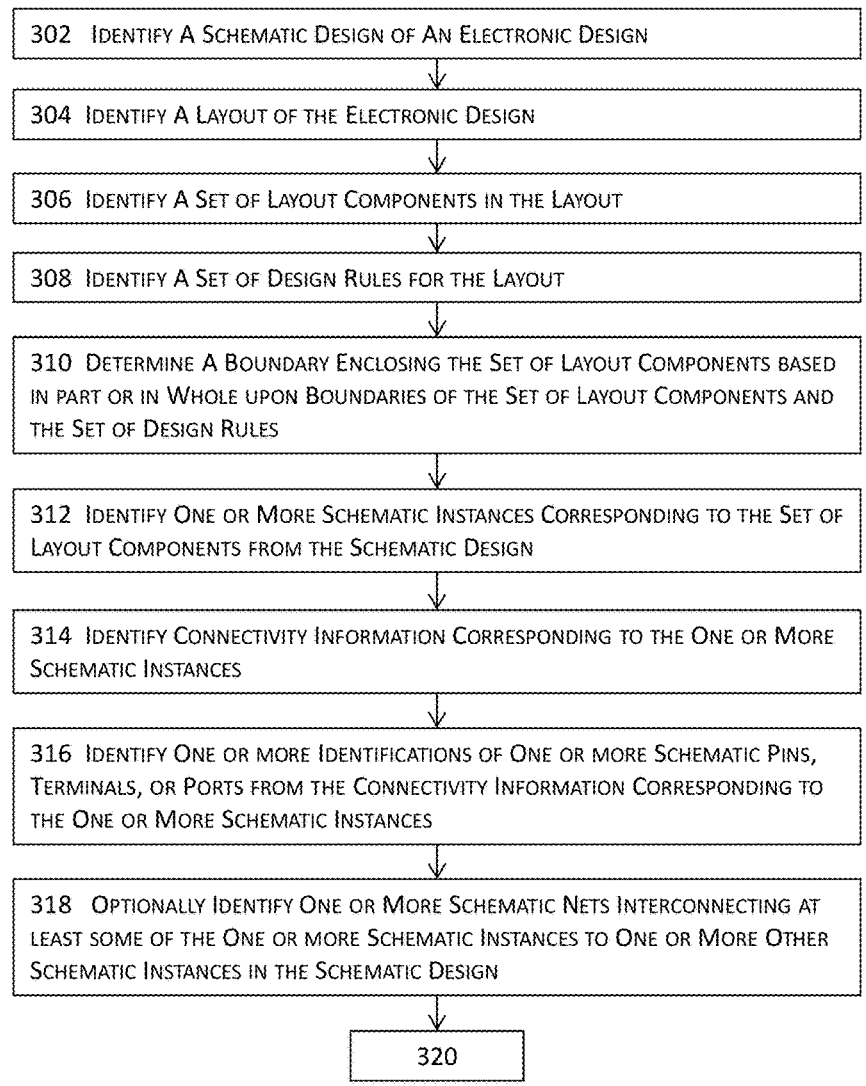
FIGS. 3A-3C jointly illustrate a more detailed block diagram for manipulating a hierarchical structure of the electronic design in one or more embodiments.
Figure 3B:
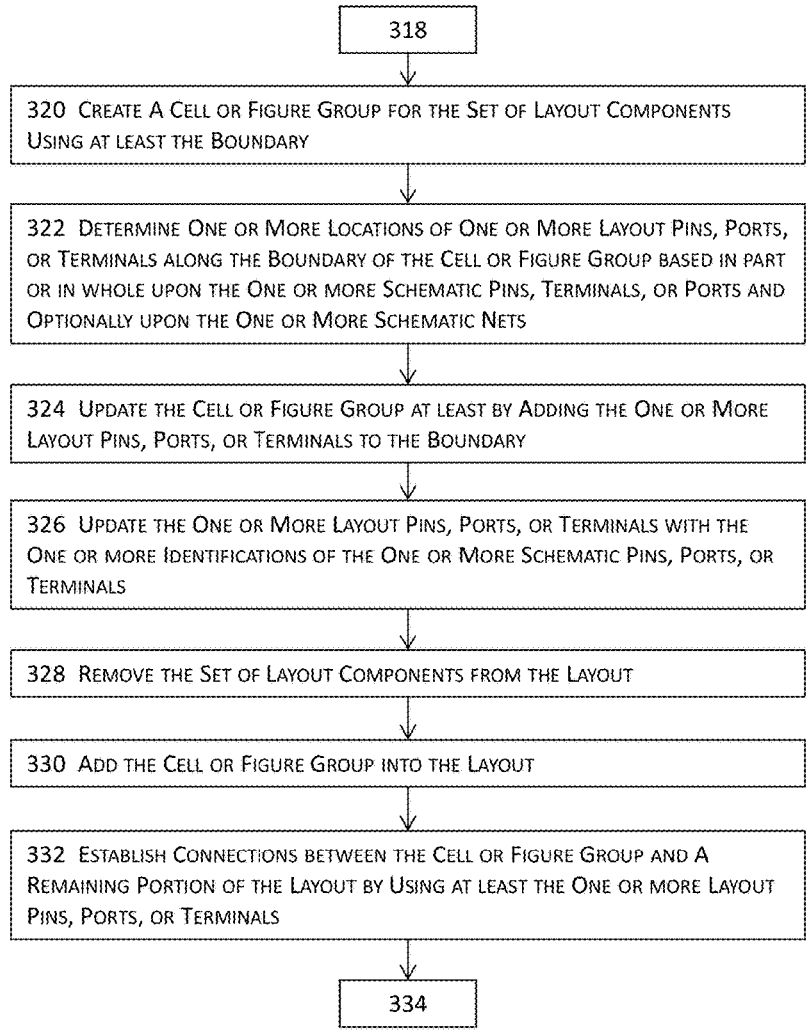
Figure 3C:
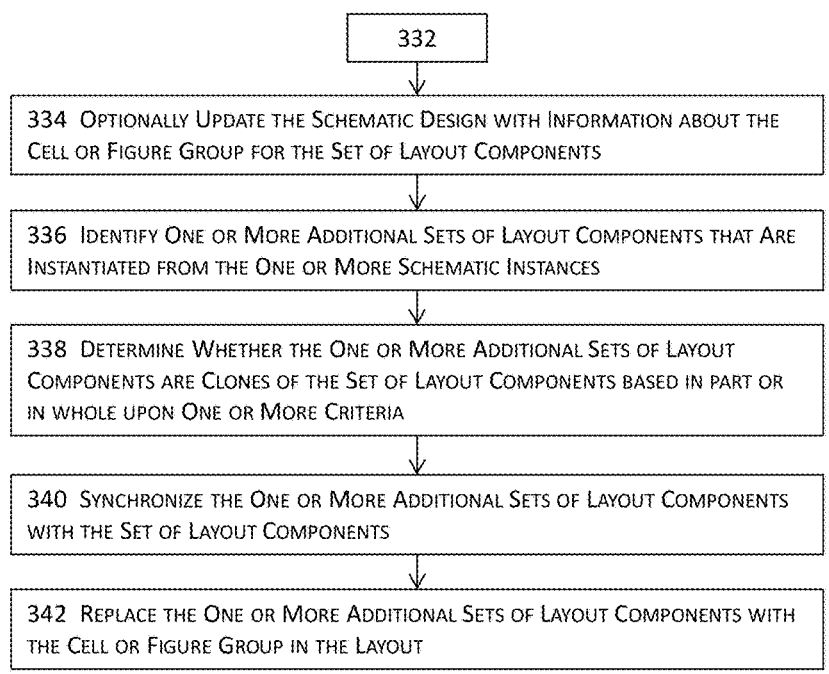

FIGS. 3A-3C jointly illustrate a more detailed block diagram for manipulating a hierarchical structure of the electronic design in one or more embodiments. In these embodiments, a schematic design may be identified at 302; and a layout corresponding to the identified schematic design may be identified at 304. This layout may be generated by instantiating each schematic instance or schematic circuit component into corresponding layout components in the layout and further by interconnecting the instantiated layout components base in part or in whole upon at least the schematic connectivity information from the schematic design.

A set of layout components may be identified at 306 in the layout. As previously mentioned, a set of layout components may be identified in many different ways. For example, a designer may select the set of layout components from the layout in a user interface of a physical design module (e.g., 104). As another example, a set of layout components may be identified by first identifying a schematic instance or a schematic circuit component and then identifying at least one set of circuit components that is instantiated from the identified schematic instance or schematic circuit component. In some of these embodiments illustrated in FIGS. 3A-3C, a set of design rules may also be optionally identified at 308. This set of design rules may be optionally referenced in the subsequent construction of a figure group. To construct a figure group, a boundary that encloses the set of layout components may be determined at 310 based in part or in whole upon at least some of the boundaries of the set of layout components. For example, the boundary may be determined at 310 to include the minimal bounding box for the set of layout components in some embodiments or the minimal bounding box for the set of layout components plus a uniform or non-uniform offset from the minimal bounding box in some other embodiments.

Because the layout is created by instantiating each schematic instance or schematic circuit component as one or more corresponding layout components in the layout, one or more schematic instances or schematic circuit components from which the set of layout components is instantiated may be identified at 312 from the corresponding schematic design. For example, these one or more schematic instances or schematic circuit components may be identified by querying the schematic design database or the layout database that may include or be associated with correspondence information between each schematic instance or schematic circuit component and its instantiated layout component information.

As described above, a figure group is more than just serving as a place holder to occupy an area in a layout for a set of layout components. Rather, a figure group is described here to address the shortfall of conventional approaches that group a plurality of layout components into a cell without having any connectivity information or with manually guesstimated layout information. Therefore, a figure group may also include or be associated with layout connectivity information, and the layout connectivity information may be automatically populated for a figure group without any human intervention in some embodiments. In some embodiments, one or more modules (e.g., a physical design module 104, an interconnection module 112, a figure group generation module 110, etc.) may identify, at 314, schematic connectivity information that correspond to the one or more schematic instances or schematic circuit components from the schematic design. The schematic connectivity information delineates how these one or more schematic instances or schematic circuit components are connected to one another and to the remaining portion of the schematic design.

One or more identifications of one or more pins may be identified at 316 from the schematic connectivity information. For example, the names of various pins in the one or more schematic instances or schematic circuit components may be identified at 316. One or more net identifications may also be optionally identified at 318 for one or more nets that interconnect at least some of the one or more schematic instances or schematic circuit components to the remaining portion of the schematic design. A figure group or a cell may be created at 320 for the set of layout components using at least the boundary determined at 310.

As described above, a figure group may be created by identifying a plurality of layout components in a layout, by representing the plurality of layout components as corresponding figures, and by creating a boundary or a bounding box enclosing the plurality of identified layout components. The boundary or bounding box may be created to be the minimum rectangular box enclosing the plurality of device designs in some embodiments or the minimum bounding box of the plurality of device designs plus an offset to enclose the plurality of device designs in some other embodiments.

A figure group may be nested within another figure group, and a figure group may also be nested within the same figure group. In addition, a figure group may represent an abstraction of the layout details of the devices within the figure group. A figure group serves not only as a light-weight cell that includes a plurality of figures representing the areas occupied by the corresponding plurality of layout components but also as an IC layout mechanism to address the shortcomings of conventional approaches that either group a set of layout devices into a cell while providing no connectivity information or requiring manual addition and guesstimates of at least some of the layout connectivity information. As a result, a figure group may provide a fully-featured layout mechanism to provide or associate with all desired or required information or data as a conventional cell or block does.

To provide layout connectivity information, especially when routing details are missing for the layout, one or more locations of one or more layout pins along the boundary of the cell or figure group may be determined at 322. In some embodiments where the boundary of the figure group is the minimal bounding box of the set of layout components, these one or more layout pin locations may be extracted from the corresponding locations of the set of layout components. In some other embodiments where the boundary is the minimal bounding box plus some uniform or non-uniform offset, this determination of the layout pin locations may be determined based in part or in whole upon the information about the corresponding schematic pins and optionally upon the one or more schematic nets that are optionally identified at 318.

In some of these latter embodiments, these layout pin locations may be determined as the intersections between the boundary of the figure group and the corresponding physical nets. Once the layout pin locations are determined, the cell or figure group may be updated at 324 at least by adding the one or more layout pins, ports, or terminals to the boundary. The names of the layout pins, ports, or terminals may be automatically populated from the corresponding schematic connectivity information. In these embodiments, the figure group includes not only a set of figures but also the layout connectivity information. A figure group may also point to the set of layout components, and a figure in the figure group may point to its respective layout component so that a designer may freely descend into any figure group to modify the figure group or a layout component therein. The one or more layout pins, ports, or terminals may be updated at 326 with the one or more identifications of the corresponding one or more schematic pins, ports, or terminals.

The layout may then be modified by removing the set of layout components from, by suppressing (e.g., by hiding) the set of layout components in, or by pushing down the set of layout components to a lower virtual or logical hierarchy in the layout at 328. The cell or the figure group created at 320 may be added into the layout at 330 with a proper handle or anchor to affix the cell or figure group to the correct location in the layout (e.g., the pin locations in the figure group match those in the set of layout components). The interconnections between the newly added cell or figure group may be established at 332 at least by using at least the one or more layout pins, ports, or terminals along the boundary of the cell or figure group.

The schematic design may also be optionally updated at 334 with the information about the addition of the newly created cell or figure group for the set of layout components. For example, the one or more schematic instances or schematic circuit components may now be associated with the corresponding schematic instance of the newly added cell or figure group.

As briefly described above, figure groups may be used to determine or replicate clones in a layout in some embodiments. In these embodiments, one or more addition sets of layout components that are instantiated from the same one or more schematic instances or schematic circuit components may be identified at 336. It may be determined at 338 whether the one or more additional sets of layout components are clones of the set of layout components based in part or in whole upon one or more criteria. These one or more criteria may include, for example, whether the topologies of two sets of layout components are identical or substantially similar. For example, two sets of layout components having identical structures may be determined to be clones of one another. As another example, two sets of layout components that do not have exactly identical structures, but the differences in their respective structures may be negligible may also be considered as clones of each other.

Any instance of a cell, block, or module in a layout may be represented as a figure group, and a figure group may also be a source of a cloning operation that identifies one or more other figure groups (targets of the cloning operation) that match the source. A cloning operation may also replicate the same figure group into one or more additional, identical figure groups. Whether some instances or figure groups are clones of each other may be captured in a clone data structure that may be determined at least by adding a plurality of matching figure groups to the clone data structure to indicate whether certain figure groups are clones of one another. When multiple instances are determined to belong to a clone data structure, or when multiple figure groups representing the multiple instances are determined to belong to the clone data structure, these multiple instances or figure groups may be entirely synchronized in that when one change is made to one instance, the same change will be automatically populated in all the remaining instances.

In some embodiments where the one or more additional sets of layout components are determined to be clones of the set of layout components identified at 302, these sets of layout components may be optionally synchronized at 340 so that when a modification is made in one of these sets of layout components, the same modification is automatically populated to the remaining sets of layout components. In addition or in the alternative, these one or more additional sets of layout components in the layout may also be replaced at 342 with the cell or figure group determined above.

Figure 4A:
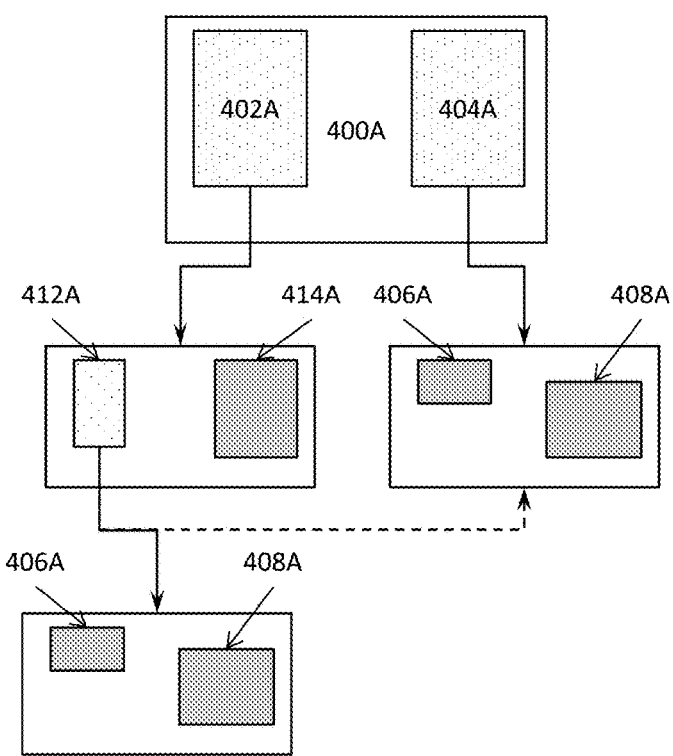
FIGS. 4A-4C illustrate an example of the application of some techniques described herein to a simplified portion of an electronic design in some embodiments.
Figure 4B:
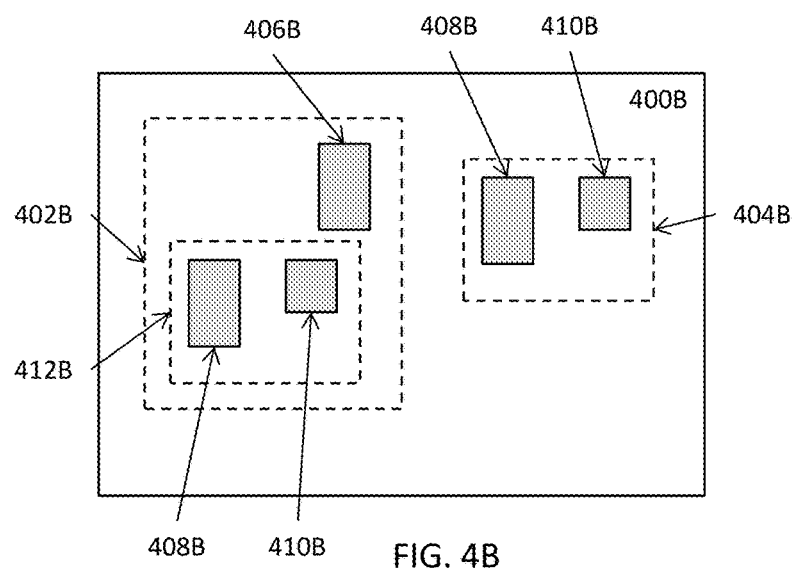
Figure 4C:
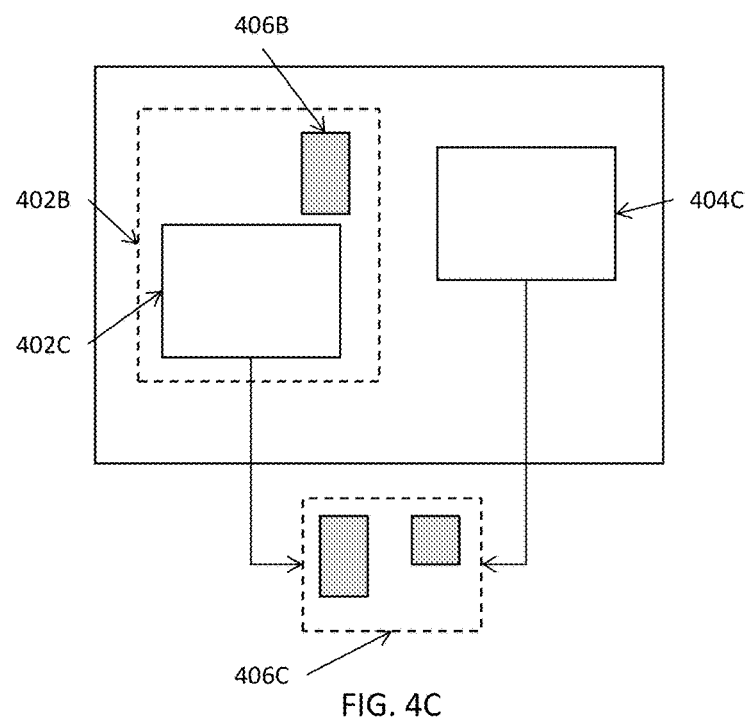

FIGS. 4A-4C illustrate an example of the application of some techniques described herein to a simplified portion of an electronic design in some embodiments. More specifically, FIG. 4A illustrates an example hierarchical structure of a schematic design 400A including two schematic instances 402A and 404A. Schematic instance 404A includes two individual schematic components 406A and 408A with no lower hierarchies. Schematic instance 402A includes another instance 404A and an individual schematic circuit component 414A, where schematic instance 412A includes the same individual schematic circuit components 406A and 408A as indicated by the identical 406A and 408A in the respective instances.

FIG. 4B illustrates an example of a simplified layout portion 400B that corresponds to the example schematic design 400A. More specifically, the simplified layout portion 400B includes a plurality of layout blocks or groups (e.g., FigGroups of OpenAccess) at multiple hierarchies. The simplified layout portion 400B includes a first block or group 402B and a second block or group 404B at a first hierarchy. The first block or group 402B further includes a third block or group 412B and an individual layout component 406B at a lower hierarchy. This third block or group 412B includes the same individual layout components 408B and 410B with identical topology. Therefore, the simplified layout portion 400B includes two blocks or groups of the same master—404B at the higher hierarchy as the first block or group 402B, and 412B at the lower hierarchy within the first block or group 402B.

FIG. 4C illustrates a simplified example of creating a layout cell for a plurality of layout components. It may be assumed that the simplified layout portion 400B is a flat layout, and that a designer may desire to create a layout cell to represent individual layout components 408B and 410B enclosed within 402B. In this example, the designer may select individual layout components 408B and 410B from the simplified layout 400B and issue a command to create a layout cell. These techniques described herein may automatically generate a boundary 402C having a non-uniform offset to the minimal bounding box of 408B and 410B to enclose individual layout components 408B and 410B. Once the bounding box is determined, these techniques may further determine the layout connectivity information for the figure group based on the schematic connectivity information as described above and replace the individual layout components 408B and 410B with the layout cell as illustrated in FIG. 4C.

In addition, these techniques may further identify that the simplified layout 400B includes a different set of layout components 404B that is a clone of the set of layout components enclosed within 412B. These techniques may thus replace this different set of layout components 404B with another instance 404C of the same layout cell. Also, these techniques allow a designer to descend into or edit the contents of a figure group as described earlier. More specifically, the figure groups may edit either figure in FIG. 4C, and the details 406C including individual layout components (408B and 410B) that are linked to the figure group will be presented to the designer for edits.

In some embodiments, a set of selected layout components may also constitute a FigGroup in OpenAccess. For example, 412B may represent the boundary of a FigGroup, and 402B may represent the boundary of another FigGroup that also includes FigGroup 412B. These techniques described herein may generate a layout cell for individual layout components as described in the preceding paragraphs or for one or more such OpenAccess FigGroups. These techniques determine the layout components for the generated layout cell from the layout or the contents of the selected FigGroup. Moreover, the pins, ports, or terminals may be determined from the corresponding schematic cell. In addition, these techniques also determine the connectivity within the layout cell as well as between the layout cell and the remaining portion of the layout from the corresponding schematic cell.

In this manner, the figure group (e.g., a layout cell) thus generated includes not only the actual layout components or figures thereof but also the pin, port, or terminal locations along the boundary of the figure group and the connectivity information within the generated figure group (e.g., a layout cell) as well as the connectivity information between the generated figure group and the remaining portion of the layout in which the generated figure group is located. As presented mentioned, a figure group may constitute and thus be identical to a layout cell in some embodiments. In these embodiments, a figure group may be used in exactly the same manner as a layout cell, and a figure group preserves all the physical design details as a layout cell does. In some other embodiments, a figure group may represent a light-well cell or block that includes the figures respectively and exactly or approximately representing the internal layout components, locations and identifications of one or more pins, ports, or terminals along the boundary of the figure group, and connectivity information within the figure group as well as between the figure group and the remaining portion of the layout. In these latter embodiments, a figure group may also be edited by invoking, for example, a layout module 104 to modify its contents.

Figure 4D:
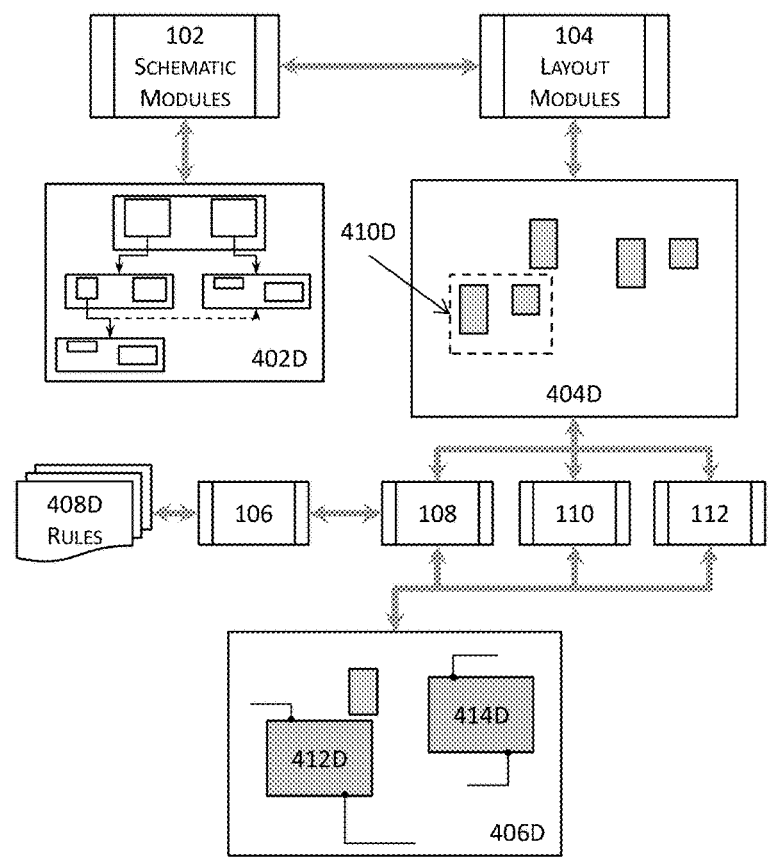
FIG. 4D illustrates an example of a high level system diagram for manipulating a hierarchical structure of the electronic design in one or more embodiments.

FIG. 4D illustrates an example of a high level system diagram for manipulating a hierarchical structure of the electronic design in one or more embodiments. In these embodiments, a figure group may be generated for the two individual layout components enclosed by 410D in the layout 404D. For example, a designer may select these two layout components via a layout module 104 that is communicably coupled with a schematic module 102 that has native access to the corresponding schematic design 402D.

Upon or shortly after the issuance of a command to create a layout cell for the selected layout components or group (e.g., an OpenAcess FigGroup), the layout module 104 may invoke one or more modules such as a hierarchy manipulation module 108, a figure group generation module 110, and an interconnection module 112 to generate a figure group for the selected layout components and replace the selected set of layout components with the figure group 412D. These modules may also function in tandem with the rule and constraint module 106 that ensure that the manipulations on the layout 404D comply with pertinent design rules 408D. These techniques may also replace one or more clones of the selected set of layout components with another instance of the same figure group as shown by 414D in the modified layout 406D of the original layout 404D.

Figure 5A:
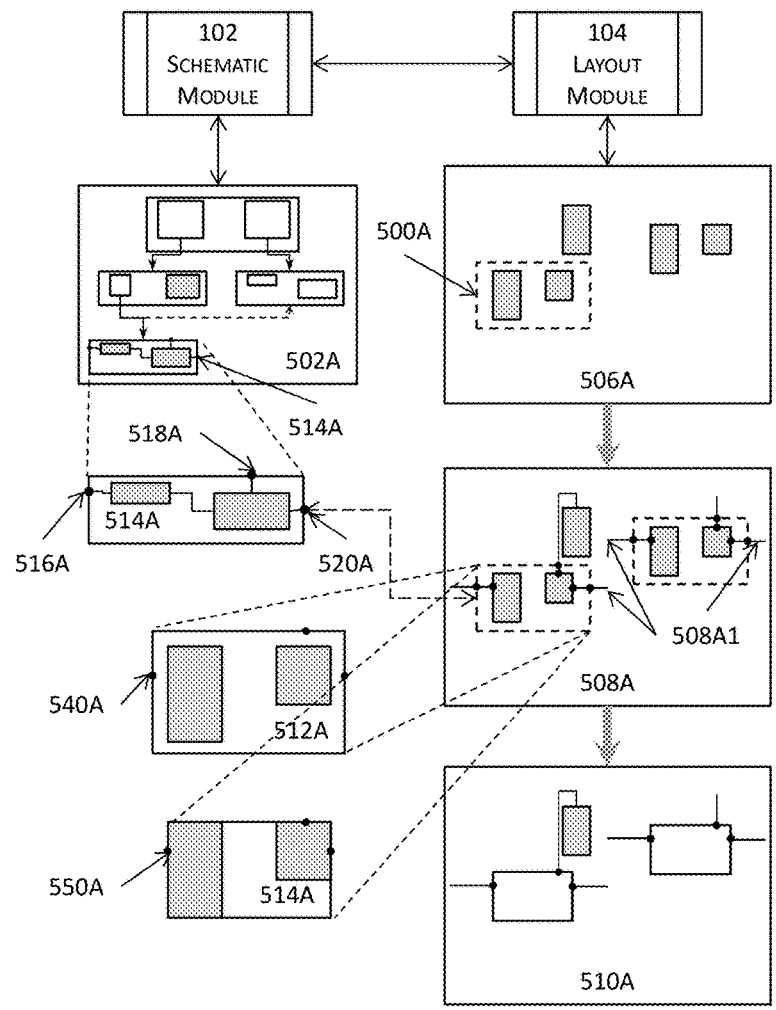
FIGS. 5A-5B jointly illustrate another example of another application of various techniques described herein to a portion of a simplified electronic design in some embodiments.
Figure 5B:
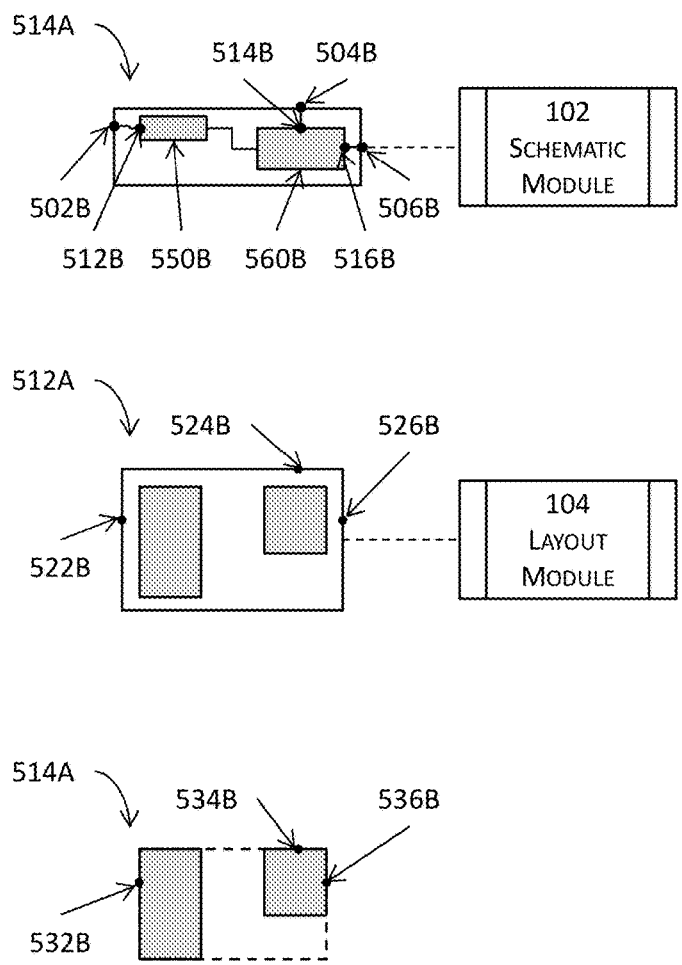

FIGS. 5A-5B jointly illustrate another example of another application of various techniques described herein to a portion of a simplified electronic design in some embodiments. In these embodiments, a figure group may be generated for the two individual layout components enclosed by 500A in the layout 506A. For example, a designer may select these two layout components enclosed by 500A via a layout module 104 that is communicably coupled with a schematic module 102 that has native access to the corresponding schematic design 502A. According to the correspondence between the schematic design 502A and the layout 506A, schematic instance 514A may be identified to correspond to the selected layout components enclosed by 500A. That is, the two selected layout components are instantiated from the schematic instance 514A. Upon or shortly after the issuance of a command to create a figure group (or a cell) for the selected layout components, the layout module 104 may create a figure group 514A that includes a boundary equal to the minimal bounding box of the two selected layout components enclosed by 500A in some embodiments, or may create another figure group 512A that includes a boundary equal to the minimal bounding box of the two selected layout components enclosed by 500A plus a non-uniform offset in some embodiments.

In addition, these techniques may further determine the layout connectivity information for the figure group based in part or in whole upon the schematic connectivity information from the schematic design 502A. For figure group 514A having the boundary as the minimal bounding box defined by the two selected layout components, the layout connectivity information may be determined by retrieving the identifications of the schematic instance 514A. More specifically, the identifications of the pins, ports, or terminals 516A, 518A, and 520A may be extracted from the schematic connectivity information and be automatically populated to the figure group 514A. The locations of the layout pins, ports, or terminals for figure group 514A as shown by 550A (three occurrences) may be identified from the selected layout components in the layout 506A.

For figure group 512A having the boundary as the minimal bounding box defined by the two selected layout components plus a non-uniform offset, the layout connectivity information may also be determined by retrieving the identifications of the schematic instance 514A. More specifically, the identifications of the pins, ports, or terminals 516A, 518A, and 520A may be extracted from the schematic connectivity information and be automatically populated to the figure group 512A. The locations of the layout pins, ports, or terminals for figure group 512A as shown by 540A (three occurrences) may be determined by finding the intersections between various net segments (e.g., net segments 508A1 in 508A) and the boundary of the figure group.

The original layout 506A including five individual layout components may then be revised to become a modified layout 510A including two figure groups and one individual layout component.

FIG. 5B illustrates more details about the interrelation between determining layout connectivity information based in part or in whole upon schematic connectivity information for the example illustrated in FIG. 5A in some embodiments. In these embodiments, schematic connectivity information may be extracted from the schematic instance 514A via a schematic module 102. For example, the schematic instance 514A may include the two schematic instances 550B and 560B. The schematic connectivity information may include the pin name 512B for the schematic instance 550B and the pin name 516B for the schematic instance 516B. The schematic connectivity information may also optionally include the pin name 502B connecting to the schematic pin represented by 512B for the schematic instance 550B as well as the pin name 506B connected to the pin represented by 516B for the schematic instance 516B. These two optional pin names may represent the ports at which the schematic instance 514A is connected to the remaining portion of the schematic design (502A).

FIG. 5B further illustrates the figure group 512A whose boundary is defined as the minimal bounding box defined by the two selected layout components plus a non-uniform offset. The layout module 104 may function in tandem with one or more other modules to populate the schematic connectivity information to the figure group 512A. More specifically, the names of the pins along the boundary may be populated from the schematic connectivity information. For example, the pin name for 502B may be populated for pin 522B; the pin name for 504B may be populated for pin 524B; and the pin name for 506B may be populated for pin 526B in some embodiments. The locations of these layout pins along the boundary may be determined as the intersections between respective layout net segments and the boundary of the figure group 512A.

FIG. 5B also illustrates the figure group 514A whose boundary is defined as the minimal bounding box defined by the two selected layout components. The layout module 104 may function in tandem with one or more other modules to populate the schematic connectivity information to the figure group 514A. As with the figure group 512A, the names of the pins along the boundary may also be populated from the schematic connectivity information. For example, the pin name for 512B may be populated for pin 532B; the pin name for 514B may be populated for pin 534B; and the pin name for 516B may be populated for pin 536B in some embodiments. The locations of these layout pins along the boundary may be extracted from the physical design details of the corresponding layout components corresponding to the figure group 514A.

Figure 6:
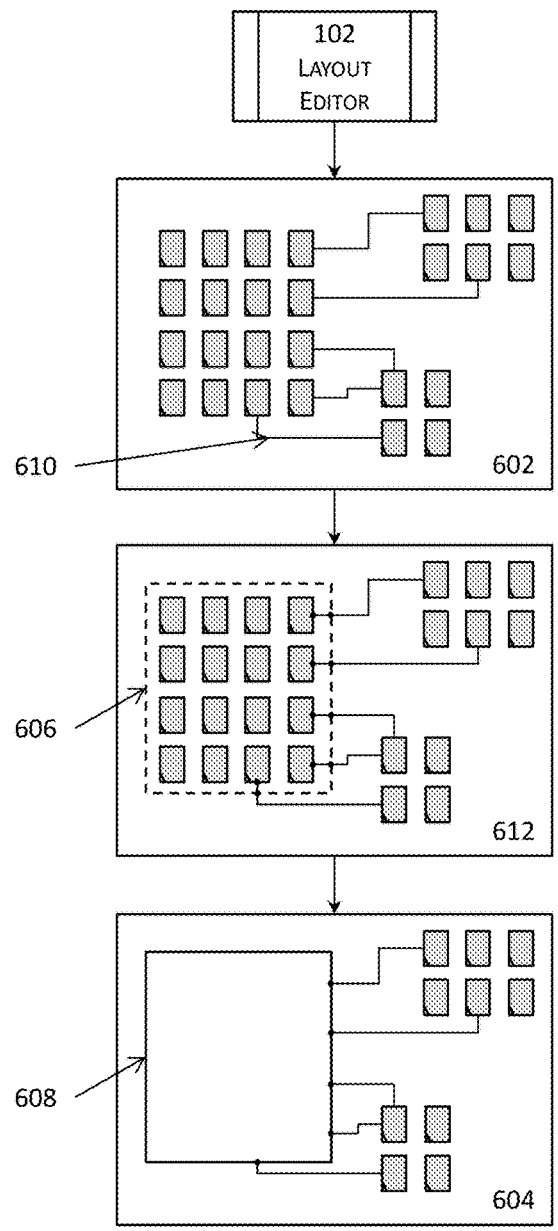
FIG. 6 illustrates another example of another application of various techniques described herein to a portion of a simplified electronic design in some embodiments.

FIG. 6 illustrates another example of another application of various techniques described herein to a portion of a simplified electronic design in some embodiments. In this example, a layout 602 includes a plurality of layout components some of which are interconnected by routes 610. A figure group 608 is to be created for the set of layout components enclosed by 606 as illustrated in 612. For example, a designer may select the set of layout components by drawing a selection box (e.g., 606) with a pointing device over this set of layout components. Various techniques described herein may determine the boundary of the figure group as represented by 606 or by determining the boundary based on pertinent design rules. These techniques may further determine the layout pin locations for the figure group by finding the intersections between the boundary (e.g., 606) and the pertinent net segments 610. The identifications of these layout pins may be determined or derived based in part or in whole upon the corresponding schematic connectivity information. The layout 602 may then be modified into 604 that includes the figure group 608, rather than the plurality of layout components enclosed by 606.

System Architecture Overview

Figure 7:
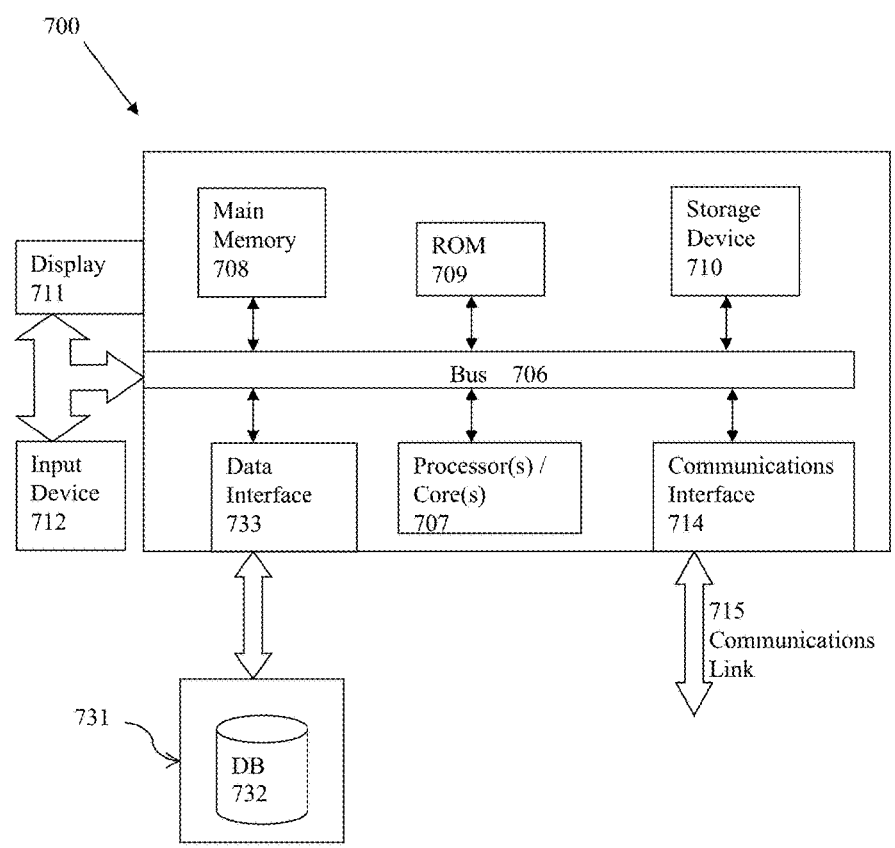
FIG. 7 illustrates a computerized system on which a method for manipulating a hierarchical structure of the electronic design may be implemented.

FIG. 7 illustrates a block diagram of a simplified illustration of a computing system 700 on which a method for manipulating a hierarchical structure of the electronic design as described in the preceding paragraphs with reference to various figures. Computer system 700 includes a bus 706 or other communication module for communicating information, which interconnects subsystems and devices, such as processor 707, system memory 708 (e.g., RAM), static storage device 709 (e.g., ROM), disk drive 710 (e.g., magnetic or optical), communication interface 714 (e.g., modem or Ethernet card), display 711 (e.g., CRT or LCD), input device 712 (e.g., keyboard), and cursor control (not shown).

According to one embodiment, computer system 700 performs specific operations by one or more processor or processor cores 707 executing one or more sequences of one or more instructions contained in system memory 708. Such instructions may be read into system memory 708 from another computer readable/usable storage medium, such as static storage device 709 or disk drive 710. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 707, where the one or more processors, one or more processor cores, or combination thereof executes one or more threads. For example, the acts of determination, extraction, stitching, simulating, annotating, analyzing, optimizing, and/or identifying, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any non-transitory medium that participates in providing instructions to processor 707 for execution. Such a medium may take many forms, including but not limited to, non-volatile media and volatile media. Non-volatile media includes, for example, optical or magnetic disks, such as disk drive 710.

Volatile media includes dynamic memory, such as system memory 708. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 700. According to other embodiments of the invention, two or more computer systems 700 coupled by communication link 715 (e.g., LAN, PTSN, or wireless network) may perform the sequence of instructions required to practice the invention in coordination with one another.

Computer system 700 may transmit and receive messages, data, and instructions, including program (e.g., application code) through communication link 715 and communication interface 714. Received program code may be executed by processor 707 as it is received, and/or stored in disk drive 710, or other non-volatile storage for later execution. In an embodiment, the computer system 700 operates in conjunction with a data storage system 731, e.g., a data storage system 731 that includes a database 732 that is readily accessible by the computer system 700. The computer system 700 communicates with the data storage system 731 through a data interface 733. A data interface 733, which is coupled to the bus 706 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 733 may be performed by the communication interface 714.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

I claim:

1. A computer implemented method for manipulating a hierarchical structure of an electronic design, comprising:
    identifying a first input and a second input at a user interface and one or more schematic instances and corresponding schematic connectivity information from a schematic design of an electronic design, the input identifying a set of layout components in a physical layout of the electronic design, and the one or more schematic instances corresponding to the set of layout components;
    in response to the second input identified at the user interface, generating, at a figure group generation module stored at least partially in memory of and functioning in conjunction with at least one microprocessor of a computing system, a logical hierarchy data structure storing a logical hierarchy and a figure group at the logical hierarchy for the set of layout components based in part or in whole upon the schematic connectivity information;
    in response to the first input identified at the user interface, reducing complexity of the physical layout in the user interface at least by transforming, at the figure group generation module, the physical layout into a transformed physical layout, transforming the layout comprising removing at least a portion of the set of layout components from the first hierarchy in the physical layout and representing the set of layout components with the figure group at the logical hierarchy;
    reducing a number of iterations for resolving alignment errors among layout circuit components across multiple hierarchies in the physical layout for implementing the electronic design at least by deriving one or more connections with respect to a boundary of the figure group based in part or in whole upon connectivity information and at least by interconnecting the figure group with one or more other figure groups in the transformed physical layout of the electronic design based at least in part upon the one or more connections; and
    causing to fabricate a version of the transformed physical layout on semiconductor fabrication equipment with one or more photomasks, wherein the semiconductor fabrication equipment comprises photolithographic equipment, and the one or more photomasks are fabricated from the version of the transformed physical layout.

2. The computer implemented method of claim 1, the process further comprising:
    synchronizing the set of layout components with one or more additional sets of layout components, which are instantiated from the one or more schematic instances, based in part or in whole upon one or more criteria.

3. The computer implemented method of claim 2, the one or more criteria comprising whether first structural information of the set of layout components and second structural information of an additional set of layout components are identical or substantially similar.

4. The computer implemented method of claim 1, the process further comprising:
    determining a boundary for the figure group based in part or in whole upon one or more characteristics of the set of layout components;
    determining a set of figures to be included in the figure group, the set of figures representing an area approximately or exactly occupied by the set of layout components in the physical layout; and
    associating the boundary and the set of figures with the figure group.

5. The computer implemented method of claim 4, the process further comprising:
    identifying layout connectivity information for the figure group based in part or in whole upon the corresponding schematic connectivity information.

6. The computer implemented method of claim 5, identifying the layout connectivity information comprising:
    populating at least a part of the schematic connectivity information to the figure group based in part or in whole upon correspondence between the one or more schematic instances in the schematic design and the set of layout components in the physical layout.

7. The computer implemented method of claim 5, the process further comprising:

extracting a set of pin identifications for a set of layout pins to be arranged along the boundary of the figure group;

determining respective layout pin locations for the set of layout pins;

arranging the set of layout pins at the respective layout pin locations along the boundary of the figure group; and updating the figure group with results of arranging the set of layout pins at the respective layout pin locations along the boundary.

8. The computer implemented method of claim 7, the process further comprising:

identifying one or more net segments in the physical layout;

determining a set of intersections between the boundary of the figure group and the one or more net segments; and determining the respective layout pin locations for the set of layout pins based in part or in whole upon the set of intersections.

9. The computer implemented method of claim 6, the process further comprising:

identifying one or more additional sets of layout components that correspond to the one or more schematic instances in the schematic design;

determining one or more clones for the set of layout components;

constructing a clone data structure to track the set of layout components and the one or more clones; and transforming the physical layout into a first transformed physical layout at least by replacing the one or more clones of the set of the one or more additional sets of layout components with one or more additional instances of the figure group.

10. The computer implemented method of claim 1, transforming the physical layout into a transformed physical layout comprising:

removing, suppressing, or pushing down the set of layout components in the physical layout so that the set of layout components is not shown in the physical layout;

adding the figure group into the physical layout;

affixing the figure group with a handle; and establishing interconnections between the figure group and a remaining portion of the physical layout by using at least layout connectivity information that is derived from the schematic connectivity information.

11. A system for manipulating a hierarchical structure of the electronic design, comprising:

non-transitory computer accessible storage medium storing thereupon program code;

one or more modules that include a figure group generation module and are stored at least partially in memory of one or more computing systems, include or function in conjunction with at least one hardware processor of the one or more computing systems, and are configured to execute the program code to identify a first input and a second input at a user interface and one or more schematic instances and corresponding schematic connectivity information from a schematic design of an electronic design, the input identifying a set of layout components in a physical layout of the electronic design, and the one or more schematic instances corresponding to the set of layout components;

in response to the second input identified at the user interface, the figure group generation module further functioning in conjunction with the at least one hardware processor and further executing the program code to generate a logical hierarchy data structure storing a logical hierarchy and a figure group at the logical hierarchy for the set of layout components based in part or in whole upon the schematic connectivity information;

in response to the first input identified at the user interface, the at least one hardware processor further executing the program code to reduce complexity of the physical layout in the user interface at least by transforming the physical layout into a transformed physical layout, transforming the layout comprising removing at least a portion of the set of layout components from the first hierarchy in the physical layout and representing the set of layout components with the figure group at the logical hierarchy;

the at least one hardware processor further executing the program code to reduce a number of iterations for resolving alignment errors among layout circuit components across multiple hierarchies in the physical layout for implementing the electronic design at least by deriving one or more connections with respect to a boundary of the figure group based in part or in whole upon connectivity information and at least by interconnecting the figure group with one or more other figure groups in the transformed physical layout of the electronic design at the logical hierarchy; and causing to fabricate a version of the transformed physical layout on semiconductor fabrication equipment with one or more photomasks, wherein the semiconductor fabrication equipment comprises photolithographic equipment, and the one or more photomasks are fabricated from the version of the transformed physical layout.

12. The system for claim 11, the at least one hardware processor further executing the program code to determine a boundary for the figure group based in part or in whole upon one or more characteristics of the set of layout components, to determine a set of figures to be included in the figure group, the set of figures representing an area approximately or exactly occupied by the set of layout components in the physical layout, and to associate the boundary and the set of figures with the figure group.

13. The system for claim 12, the at least one hardware processor further executing the program code to identify layout connectivity information for the figure group based in part or in whole upon the corresponding schematic connectivity information.

14. The system for claim 13, the at least one hardware processor further executing the program code to populate at least a part of the schematic connectivity information to the figure group based in part or in whole upon correspondence between the one or more schematic instances in the schematic design and the set of layout components in the physical layout.

15. The system for claim 13, the at least one hardware processor further executing the program code to extract a set of pin identifications for a set of layout pins to be arranged along the boundary of the figure group, to determine respective layout pin locations for the set of layout pins, to arrange the set of layout pins at the respective layout pin locations along the boundary of the figure group, and to update the figure group with results of arranging the set of layout pins at the respective layout pin locations along the boundary.

16. An article of manufacture comprising a non-transitory computer accessible storage medium having stored thereupon a sequence of instructions which, when executed by at least one microprocessor or at least one processor core executing one or more threads, causes the at least one microprocessor or the at least one processor core to perform a set of acts for manipulating a hierarchical structure of an electronic design, the set of acts comprising:

identifying a first input and a second input at a user interface and one or more schematic instances and corresponding schematic connectivity information from a schematic design of an electronic design, the input identifying a set of layout components in a physical layout of the electronic design, and the one or more schematic instances corresponding to the set of layout components;

in response to the second input identified at the user interface, generating, at a figure group generation module stored at least partially in memory of and functioning in conjunction with the at least one microprocessor of a computing system, a figure group for the set of layout components based in part or in whole upon the schematic connectivity information;

in response to the first input identified at the user interface, reducing complexity of the physical layout in the user interface at least by transforming, at the figure group generation module, the physical layout into a transformed physical layout, transforming the layout comprising removing at least a portion of the set of layout components from the first hierarchy in the physical layout and representing the set of layout components with the figure group at the logical hierarchy;

reducing a number of iterations for resolving alignment errors among layout circuit components across multiple hierarchies in the physical layout for implementing the electronic design at least by deriving one or more connections with respect to a boundary of the figure group based in part or in whole upon connectivity information and at least by interconnecting the figure group with one or more other figure groups in the transformed physical layout of the electronic design based at least in part upon the one or more connections; and causing to fabricate a version of the transformed physical layout on semiconductor fabrication equipment with one or more photomasks, wherein the semiconductor fabrication equipment comprises photolithographic equipment, and the one or more photomasks are fabricated from the version of the transformed physical layout.

17. The article of manufacture of claim 16, the set of acts further comprising:

determining a boundary for the figure group based in part or in whole upon one or more characteristics of the set of layout components;

determining a set of figures to be included in the figure group, the set of figures representing an area approximately or exactly occupied by the set of layout components in the physical layout;

associating the boundary and the set of figures with the figure group; and identifying layout connectivity information for the figure group based in part or in whole upon the corresponding schematic connectivity information.

18. The article of manufacture of claim 17, the set of acts further comprising:

populating at least a part of the schematic connectivity information to the figure group based in part or in whole upon correspondence between the one or more schematic instances in the schematic design and the set of layout components in the physical layout;

extracting a set of pin identifications for a set of layout pins to be arranged along the boundary of the figure group;

determining respective layout pin locations for the set of layout pins;

arranging the set of layout pins at the respective layout pin locations along the boundary of the figure group; and updating the figure group with results of arranging the set of layout pins at the respective layout pin locations along the boundary.

19. The article of manufacture of claim 18, the set of acts further comprising:

identifying one or more net segments in the physical layout;

determining a set of intersections between the boundary of the figure group and the one or more net segments; and determining the respective layout pin locations for the set of layout pins based in part or in whole upon the set of intersections.

20. The article of manufacture of claim 16, the set of acts further comprising:

removing, suppressing, or pushing down the set of layout components in the physical layout so that the set of layout components is not shown in the physical layout;

adding the figure group into the physical layout;

affixing the figure group with a handle; and establishing interconnections between the figure group and a remaining portion of the physical layout by using at least layout connectivity information that is derived from the schematic connectivity information.

* * * * *